United States Patent
Chu et al.

(10) Patent No.: US 11,079,672 B2
(45) Date of Patent: Aug. 3, 2021

(54) METHOD AND SYSTEM FOR LAYOUT ENHANCEMENT BASED ON INTER-CELL CORRELATION

(71) Applicant: TAIWAN SEMICONDUCTOR MANUFACTURING COMPANY LTD., Hsinchu (TW)

(72) Inventors: Wei-Lin Chu, Hsinchu County (TW); Hsin-Lun Tseng, Taoyuan (TW); Sheng-Wen Huang, Hsinchu (TW); Chih-Chung Huang, Hsinchu (TW); Chi-Ming Tsai, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/538,654

(22) Filed: Aug. 12, 2019

(65) Prior Publication Data

US 2020/0133117 A1    Apr. 30, 2020

Related U.S. Application Data

(60) Provisional application No. 62/753,369, filed on Oct. 31, 2018.

(51) Int. Cl.
*G06F 30/30* (2020.01)
*G03F 1/70* (2012.01)
(Continued)

(52) U.S. Cl.
CPC .............. *G03F 1/70* (2013.01); *G03F 1/22* (2013.01); *G03F 1/36* (2013.01); *G03F 7/2004* (2013.01); *G06F 30/392* (2020.01); *G06N 20/00* (2019.01)

(58) Field of Classification Search
CPC .... G03F 1/36; G03F 7/70391; G03F 7/70283; G03F 1/72; G03F 7/70433; G03F 1/84; G03F 7/705; G03F 7/70625; G03F 7/70741; G03F 1/22; G03F 1/70; G03F 7/2004; G03F 7/70125; G03F 7/70133; G03F 7/70258; G03F 7/70441; G03F 7/70525; G03F 7/70616; G06T 2207/30148; G06T 7/0006; G06T 7/33; G06T 2207/10061; G06F 30/398; G06F 2119/18; G06F 30/39; G06F 30/367; G06F 2111/04; G06F 2111/08; G06F 2119/12; G06F 30/33;
(Continued)

(56) References Cited

U.S. PATENT DOCUMENTS 8,490,034 B1 * 7/2013 Torunoglu .............. G06F 30/00
716/55
2007/0230770 A1 * 10/2007 Kulkarni ........... H01L 21/67005
382/149

(Continued)

*Primary Examiner* — Binh C Tat
(74) *Attorney, Agent, or Firm* — WPAT, P.C., Intellectual Property Attorneys; Anthony King

(57) ABSTRACT

A method and a system of performing layout enhancement include: providing a first design layout comprising a plurality of cells; updating a first cell in the plurality of cells using optical proximity correction to provide a first updated cell and a data set; updating a second cell from remaining cells in the first design layout based on the data set to provide a second updated cell; and manufacturing a mask based on the first updated cell and the second updated cell in the first design layout.

20 Claims, 8 Drawing Sheets

(51) Int. Cl.
*G03F 1/36* (2012.01)
*G03F 1/22* (2012.01)
*G03F 7/20* (2006.01)
*G06N 20/00* (2019.01)
*G06F 30/392* (2020.01)

(58) Field of Classification Search
CPC ........ G06F 30/30; G06F 30/20; G06F 30/333; G06F 30/00; G06F 30/392; G06F 21/602; G06F 21/608; B33Y 30/00; B33Y 10/00; H01J 2237/2817; H01J 37/226; H01J 37/3174
USPC ...................................... 716/50–56
See application file for complete search history.

(56) References Cited

U.S. PATENT DOCUMENTS

2013/0198700 A1* 8/2013 Sakajiri .................... G06F 30/00
716/53
2018/0173090 A1* 6/2018 Wang ......................... G03F 1/36
2018/0238816 A1* 8/2018 Sousa .............. G01N 21/95607

* cited by examiner

METHOD AND SYSTEM FOR LAYOUT ENHANCEMENT BASED ON INTER-CELL CORRELATION

PRIORITY CLAIM AND CROSS-REFERENCE

This application claims priority to U.S. Provisional Application No. 62/753,369 filed Oct. 31, 2018, the disclosure of which is hereby incorporated by reference in its entirety.

BACKGROUND

In advanced semiconductor technologies, the continuing reduction in device size and increasingly complicated circuit arrangements have made the design and fabrication of integrated circuits (ICs) more challenging and costly. Before a circuit design for the ICs is delivered for mass production, the design must be confirmed as meeting the design specification and manufacturing criteria. In order to detect design errors or defects as early as possible, circuit designers use computer-aided circuit design tools, which have become widely accepted in the semiconductor industry, to assist in identifying potential defects. However, as circuit complexity and device density continue to increase, the software procedures involved in circuit design and verification now consume a great deal of time and resources. Therefore, it is necessary to improve the design flow for reducing design cycle time while maintaining design quality.

Light diffraction in an optical lithography operation presents one obstacle to reducing the feature size. Common techniques used to compensate for the light diffraction effect include optical proximity correction (OPC). These methods may be performed repeatedly across the design layout in order to ensure acceptable enhancement results for all patterns in the design layout. As a result, a large amount of software resources may be required and significant cost may be incurred to perform lithography enhancement on the design layout. Design inefficiency and process cost have thus become challenges to be overcome in order to attain economical mass production of the devices. Accordingly, there is a need for a more effective lithography enhancement approach that does not compromise performance.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
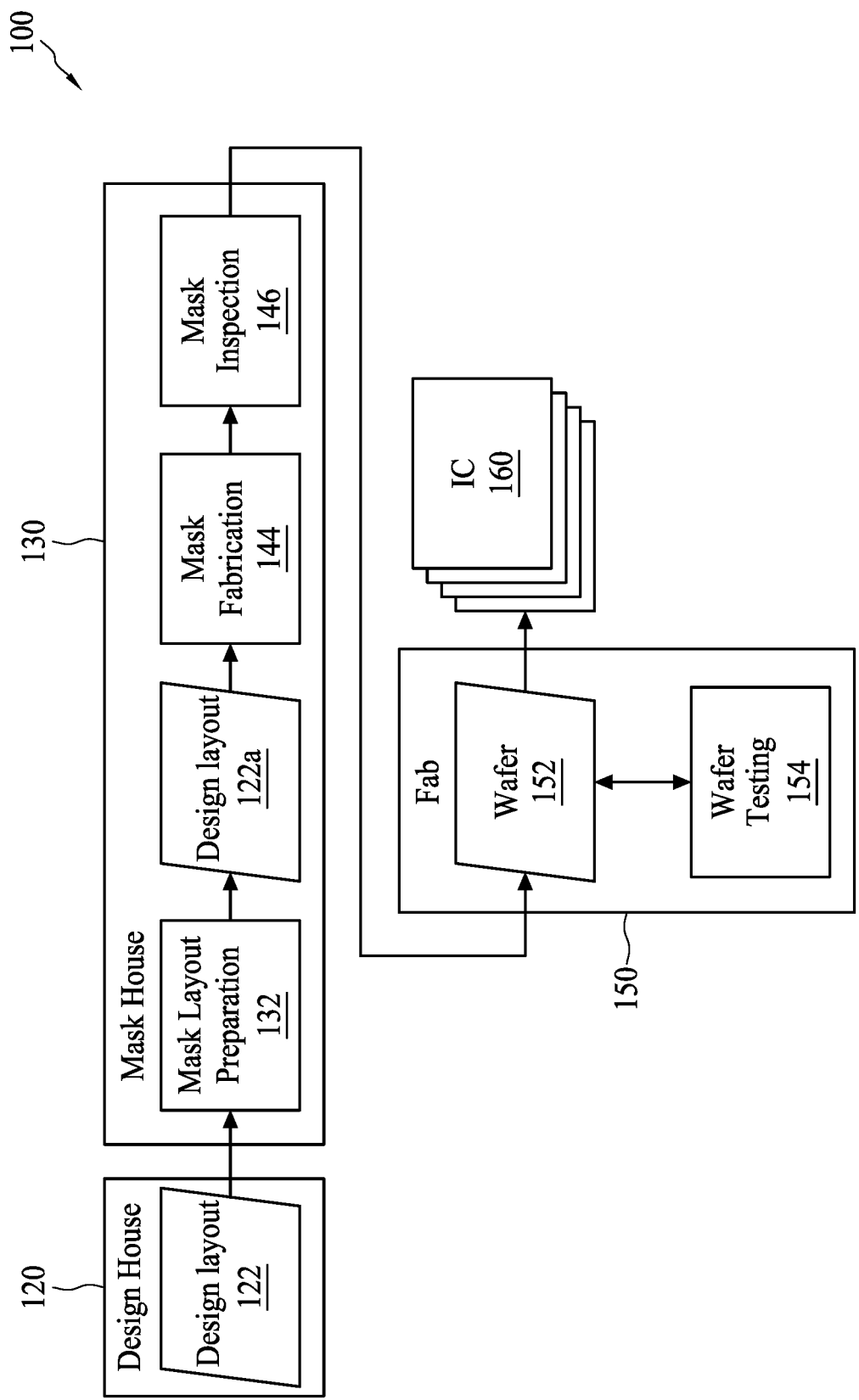
FIG. 1 is a schematic diagram showing an integrated circuit (IC) manufacturing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "layout," "design layout" and "mask layout" used throughout the present disclosure refer to a representation of an integrated circuit (IC) in terms of geometric patterns which correspond to the features of the IC, such as a metal layer, a dielectric layer, or a semiconductor layer that make up the components of the IC. In some examples, the terms "layout," "design layout" and "mask layout" refer to a data file including machine-readable codes or text strings that can be converted into the geometric patterns. Additional information, such as parameters extracted from the geometric patterns, in relation to the IC may be included in the layout or design layout for enhancing the design and manufacturing processes of the IC.

The term "cell" used throughout the present disclosure refers to a group of circuit patterns in a design layout to implement specific functionalities. A cell is comprised of various patterns and may be expressed as unions of polygons. A design layout may be initially constructed by an array of identical or different cells during the layout design stage. The geometries of the patterns in the cells may be adjusted at different stages of layout design in order to compensate for design and process effects. A cell may cover circuits corresponding to a portion or an entirety of a die to be manufactured, or a group of dies. A mask may be formed to implement the patterns of one or more cells thereon and to transfer these cell patterns to a semiconductor substrate or wafer.

The term "optical proximity correction" or "OPC" used throughout the present disclosure refers to a generic lithography enhancement technique processed on a design layout. The OPC is performed on one or more cells in the design layout dependent upon optical factors associated with each cell; therefore, the enhancement results of the cells in the same design layout may be different. In some examples, the term "optical proximity correction" refers to existing optical proximity correction frameworks where enhancement of the cells in the same design layout is conducted independently of other cells. In some cases, the term "optical proximity correction" refers to existing optical proximity correction methods without leveraging in-situ enhancement results of other cells in the same design layout.

The present disclosure relates generally to the field of semiconductor devices, and relates more particularly to a lithography enhancement method using extreme ultraviolet (EUV) light. Lithography enhancement is employed for modifying patterns of a design layout such that the enhanced design layout takes into account the process factors, such as the optical effects, of the lithography operations. Moreover, the task of the lithography enhancement is more complicated for EUV lithography (EUVL) because the influence of the optical effects, such as diffraction and interference, on the exposure performance is more pronounced in EUVL than with other exposure sources with a greater wavelength. Therefore, it is crucial to improve the efficiency of the EUVL operation while keeping the cost at an acceptable level.

In the present disclosure, a simplified EUVL enhancement procedure, which is applied to a design layout comprising identically or similarly structured cells, is proposed. The proposed lithography enhancement framework is mainly comprised of two phases, i.e., a training phase and an enhancement phase. During the training phase, an enhancement model, including the model-specific parameters trained for extracting the correlation between the cell patterns before and after enhancement, is built. The parameters may be further trained for extracting the correlation of enhancement results between different cells in the layout. The enhancement model may consider inter-cell correlations between the cells in the design layout, e.g., the spatial relationship or pattern similarity between two cells in the design layout. During the enhancement phase, a reference cell in the design layout is selected and undergoes an optical proximity correction operation without consideration of its neighboring cells. Subsequently, the enhancement model is incorporated to help determine the enhancement results of remaining cells other than the reference cell in the design layout. The enhancement result for a target cell is calculated under the enhancement model given the input of the enhancement result of the reference cell and the correction between the target cell and the reference cell. The proposed correlation-based enhancement framework exhibits promising performance that is only insignificantly different from the performance of the existing non-correlation-based approach while greatly increasing the lithography enhancement efficiency and reducing the processing cost. Although the proposed framework can help facilitating the lithography enhancement operations for the design layout comprising an array of identical cells, such framework may also be applicable to a design layout formed of cells having different patterns.

FIG. 1 is a schematic diagram showing an IC manufacturing system 100 in accordance with some embodiments. The IC manufacturing system 100 is configured to manufacture an integrated circuit device 160 through a plurality of entities, such as a design house 120, a mask house 130, and an IC manufacturer (fab or foundry) 150. The entities in the IC manufacturing system 100 are linked by a communication channel, e.g., a wired or wireless channel, and interact with one another through a network, e.g., intranet or the internet. In an embodiment, the design house 120, mask house 130 and IC manufacturer 150 belong to a single entity, or are operated by independent parties.

The design house (or design team) 120 generates a design layout 122 in an IC design phase for the IC 160 to be fabricated. The design layout 122 includes descriptions of various geometrical patterns designed for performing specific functions that conform to the performance and manufacturing specifications. The geometrical patterns represent circuit features in the fabricated IC 160, e.g., metal layers, dielectric layers, or semiconductor layers, that form various IC components, such as an active region, a gate electrode, a source and drain, and metal lines or vias of an interlayer interconnection. In an embodiment, the design house 120 operates a circuit design procedure to generate the design layout 122. The circuit design procedure may include, but is not limited to, logic design, physical design, pre-layout simulation, placement and routing, timing analysis, parameter extraction, design rule check and post-layout simulation. The design layout 122 may be converted from description texts into their visual equivalents to show a physical layout of the depicted patterns, such as the dimensions, shapes and locations thereof. In an embodiment, the design layout 122 can be expressed in a GDSII or DFII file format.

The mask house 130 receives the design layout 122 from the design house 120 and manufactures one or more masks according to the design layout 122. In an embodiment, the mask house 130 includes a mask layout preparation block 132, a mask fabrication block 144 and a mask inspection block 146. The mask layout preparation block 132 modifies the design layout 122 such that a resulting design layout 122a can allow a mask writer to transfer the design layout 122 as desired. Generally, the design layout 122a may include replicated cells thereon. When a mask is formed, it is used to transfer the patterns of the cells to a semiconductor wafer repeatedly, and the pattern transfer is done with an exposure area, termed an exposure field, in each shot. In addition, scribe line regions or test structures may be formed in spaces between the cells. In some embodiments, the mask layout preparation block 132 is configured to determine the locations of dies that are to be included in a cell, the locations and widths of scribe line regions around the cells, and the locations and types of test structures to be formed in the scribe line regions. The operations of the mask layout preparation block 132 are described in greater detail below in descriptions related to FIG. 2.

The mask fabrication block 144 is configured to form a mask by preparing a substrate based on the design layout 122a provided by the mask layout preparation block 132. A mask substrate is exposed to radiation based on the pattern of the design layout 122a in a photolithography operation, which may be followed by an etching operation to leave behind the patterns related to the design layout. In an embodiment, the mask fabrication block 144 introduces a checking procedure to ensure that the layout data complies with requirements of a mask writer and/or mask manufacturer and that the layout data can be used to generate the mask (photomask or reticle) as desired. The polygons of the cells as acquired are transferred to a semiconductor substrate (such as a wafer) or material layers disposed on a semiconductor substrate. An electron-beam (e-beam) or a mechanism of multiple e-beams may also be used to transfer the polygon patterns. Moreover, the mask can be fabricated in various technologies. In an embodiment, the mask is fabricated using binary technology in which a binary mask includes a transparent substrate (e.g., fused quartz) and an opaque material (e.g., chromium) coated in the opaque regions of the mask. In another example, the mask is fabricated using a phase shift technology, e.g., a phase shift mask (PSM).

After the mask is fabricated, the mask inspection block 146 inspects the fabricated mask to determine if any defects, such as full-height and non-full-height defects, exist in the fabricated mask. If any defects are detected, the mask may be cleaned or the design layout in the mask may be modified.

The IC manufacturer 150 is an IC fabrication entity that includes multiple manufacturing facilities for the fabrication of a variety of different IC products. The IC manufacturer 150 uses the mask fabricated by the mask house 130 to fabricate a semiconductor wafer 152 having a plurality of the IC devices 160 thereon. The semiconductor wafer 152 may include a silicon substrate or other suitable substrates including various layers formed thereon. In an embodiment, the IC manufacturer 150 includes an IC testing block 154 configured to ensure that the IC conforms to physical manufacturing specifications and mechanical and/or electrical performance specifications. In some embodiments, the test structures formed on the wafer 152 may be utilized to generate test data indicative of the quality of the fabricated semiconductor wafer 152. After the wafer 152 passes the testing procedure done by the wafer testing block 154, the wafer 152 may be diced (or sliced) along the scribe line regions to form separate IC devices 160. The dicing process can be accomplished by scribing and breaking, by mechanical sawing (e.g., with a dicing saw) or by laser cutting.

Figure 2:
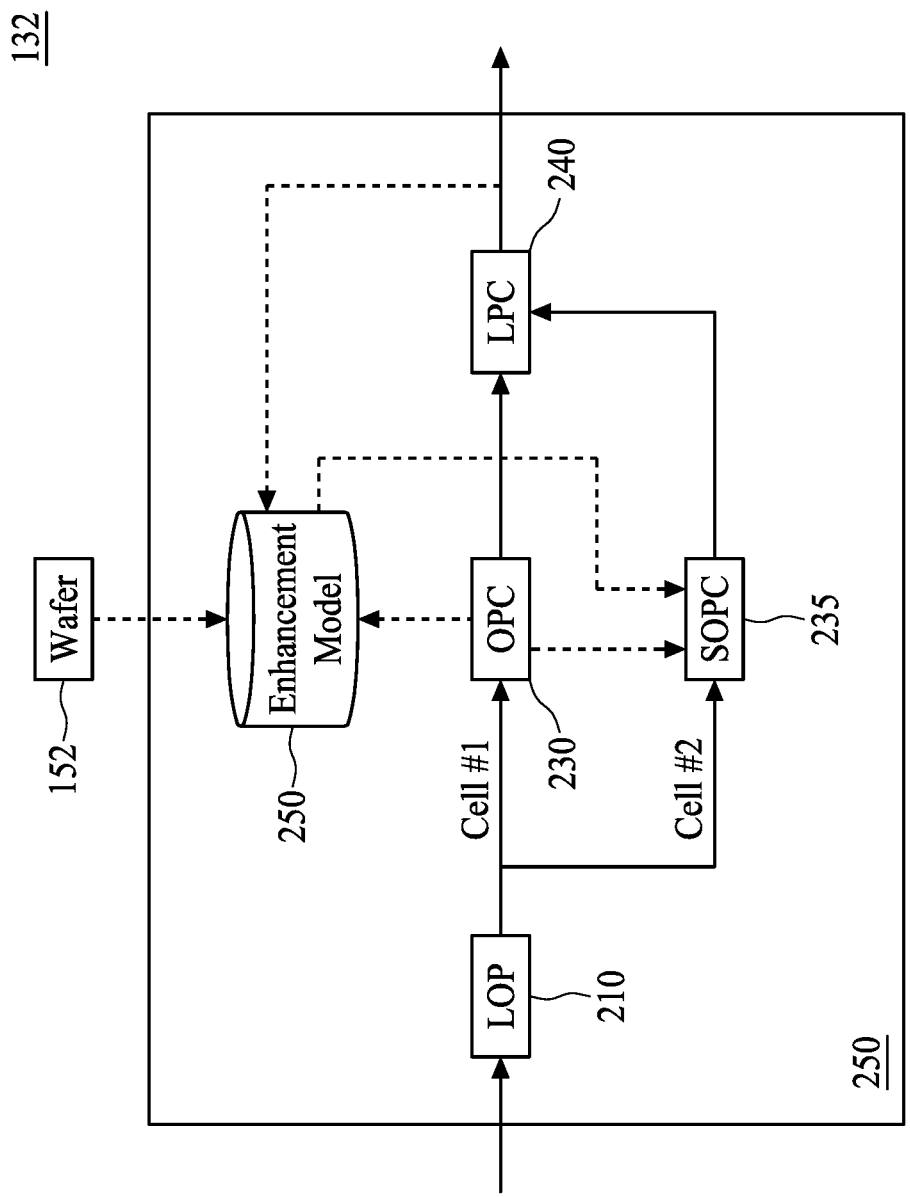
FIG. 2 is a schematic diagram showing mask layout preparation in the IC manufacturing system of FIG. 1, in accordance with some embodiments.

FIG. 2 is a schematic diagram showing the mask layout preparation block 132 in the IC manufacturing system 100 of FIG. 1, in accordance with some embodiments. The mask layout preparation block 132 includes a logic operation (LOP) module 210, an optical proximity correction (OPC) module 230, a simplified OPC (SOPC) module 235 and a lithography process check (LPC) module 240. In FIG. 2, the processing flow of the mask layout is illustrated with solid lines and the exchange of information between different modules is illustrated with broken lines.

The LOP module 210 is configured to process the design layout 122 in order to modify the design layout 122 according to specified manufacturing rules. The LOP module 210 receives a set of rules representing the manufacturing constraints from various manufacturers to check the design layout 122. If the design layout 122 does not comply with the set of rules, the design layout 122 will be modified accordingly by the LOP module 210 until the modified design layout 122 complies with the rules.

In some embodiments, one or more of the cells (denoted as cell #1 shown in FIG. 2) in the design layer 122 are sent to the OPC module. The OPC module 230 is configured to apply a lithography enhancement technique to compensate for imaging errors, such as diffraction, interference, or other effects arising from the lithography process. In some embodiments, the OPC module 230 takes into account the flare effect or slit effect of lithography operations resulting from the defects of the optical elements. The flare effect is generally referred to the stray light reaching the mask that comes from undesired reflections or scatterings within the optical elements. The slit effect is related to an arc-shaped exposure slit in which the azimuthal angle of the incident light passing through the arc-shaped exposure slit may vary from the center to the ends of the arc-shaped exposure slit. The variation of the azimuthal angle may result non-uniformity of the intensity, phase, polarization of the light passing through the slit, leading to performance degradation of the lithography operation. In an embodiment, enhancement features or patterns, such as scattering bars, serif, and/or hammerheads, are added to or removed from the design layout 122 according to established optical models or rules. For example, the OPC module 230 is configured to perform operations including resizing the original pattern, repositioning an edge of the original pattern, reshaping the original pattern, attaching an assist feature to the original pattern, adding a scattering bar to the original pattern, or a combination thereof. The contour of the original pattern or polygon may be partitioned into multiple segments or edges and the enhancement task is conducted through each of the segments.

One or more of the cells (denoted as cell #2 shown in FIG. 2) in the design layout 122 that are not sent to the OPC module 230 are sent to the simplified OPC (SOPC) module 235. In some embodiments, it is assumed that the circuit topology in the cells (cell #2) which are sent to the SOPC module 235 is identical or similar to that in the cells (cell #1) which are sent to the OPC module 230. Since the difference of circuit topologies between the cell #1 and cell #2 is minimized, the enhancement result of cell #1 can be leveraged and applied for the enhancement of cell #2 with minor changes in a simpler manner. The operations of the SOPC module 235 are provided in greater detail in subsequent paragraphs.

Throughout the present disclosure, the design layout 122 that has been enhanced through an OPC or simplified OPC operation, e.g., the patterns in the design layout 122 that have been reshaped by either the OPC module 230 or the SOPC module 235, respectively, or combinations thereof, is referred to as an "OPCed" design layout 122a. In an embodiment, the mask layout preparation block 132 may apply further resolution enhancement techniques to improve the design layout 122, such as off-axis illumination or other suitable techniques.

The LPC module 240 is configured to simulate the fabrication procedure that is to be implemented by the IC manufacturer 150. The simulation may cover the entirety or a portion of the OPCed design layout 122. In the present embodiment, the LPC module 240 simulates the design layout 122 undergoing the procedures of the LOP module 210 and the enhancement operations of one or both of the OPC module 230 and the SOPC module 235. In some embodiments, the LPC module 240 is configured to inspect the OPCed design layout 122a to determine if any problem areas, known as "hot spots," exist. The term "hot spots" refers to zones or features in the IC device 160 that exhibit characteristics negatively affecting the performance of the device. Hot spots can arise from the circuit design and/or process controls. Symptoms of hot spots include pinching/necking, bridging, dishing, erosion, RC delay, line thickness variations, Cu residue, and other problems.

The mask layout preparation block 132 further generates an enhancement model 250. The enhancement model 250 may include various model types with associated parameters that collectively correlate the design layout 122 before OPC operations and the OPCed design layout 122a under the framework of the OPC module 230 and the SOPC module 235. In an embodiment, the OPC module 230 aids in performing correlation-based lithography enhancement on a design layout having multiple copies of a cell, in which a first cell in the design layout undergoes a standalone OPC operation by the OPC module 230. The polygon edges of the first cell are partitioned into segments and the original partitioned segments correspond to newly added or reshaped segments during the standalone OPC operation. The enhancement result (e.g., the comparison between the original segments and the newly added or reshaped segments) for the first cell is further processed to derive an enhancement data set including rules or numerical values of the changes to the segments. In some embodiments, the derived enhancement data set provided by the OPC module 230 (or provided by the SPC module 240 after the checking process is completed) may be incorporated into the enhancement model 250 and aid the SOPC module 235 for enhancing the remaining cells in the design layout.

In an embodiment, the parameters in the enhancement model 250 may be trained using previously-collected edge segments of polygons in the after-development inspection (ADI) contour image of the fabricated wafer 152, or they are trained through a design layout, e.g., from the historical enhancement results of the OPC module 230 associated with other pieces of layout data.

Figure 3:
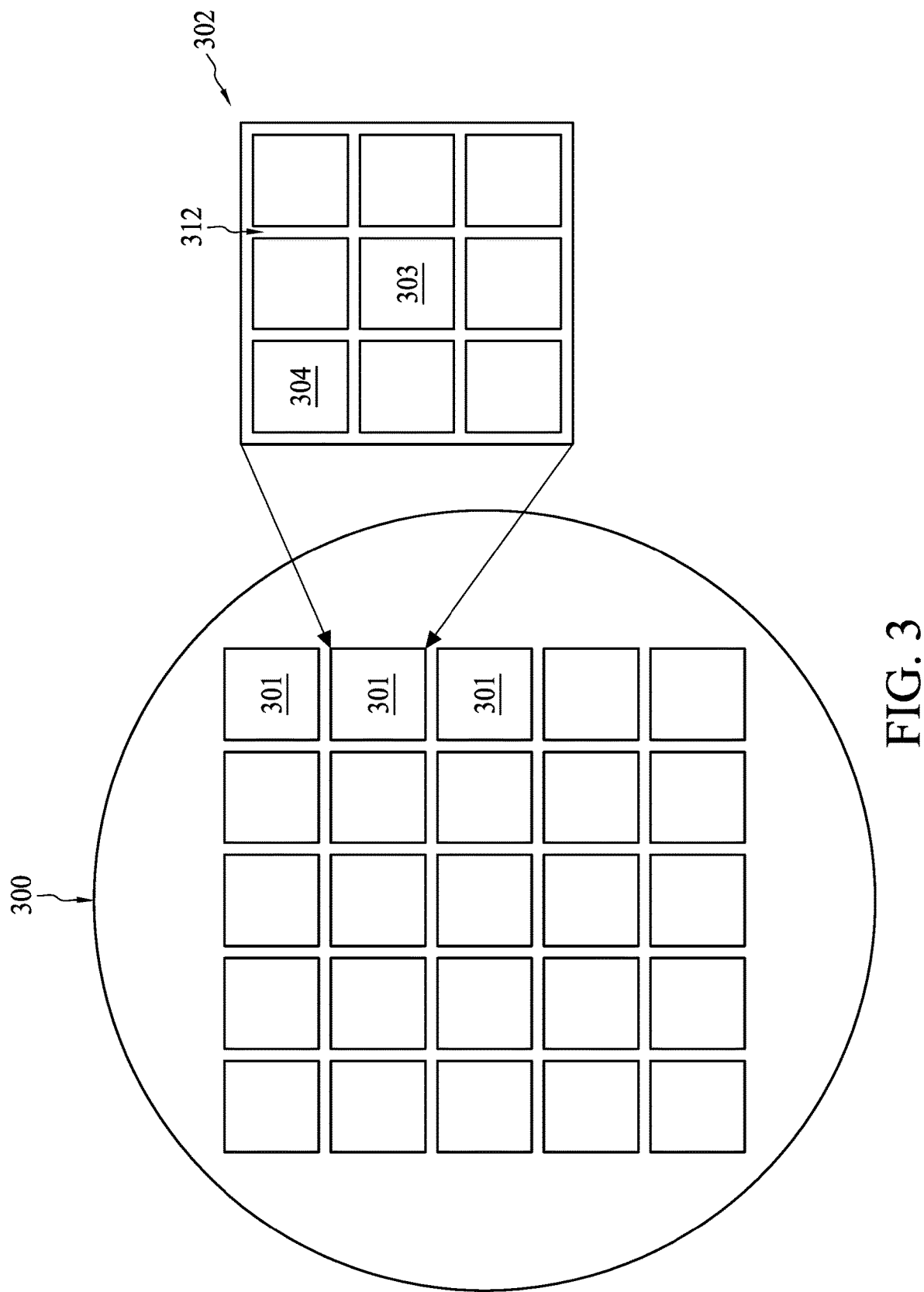
FIG. 3 is a schematic diagram of a wafer from a top-view perspective, in accordance with some embodiments.

FIG. 3 is a schematic diagram of a wafer 300 from a top-view perspective in accordance with some embodiments. The wafer 300 is partitioned into an array of exposure fields 301. A mask 302 is also shown that includes patterns defined by the design house 120 and fabricated by the mask house 130 in FIG. 1, and is configured to transfer the patterns to the wafer 300 through each of exposure fields 301. As shown in FIG. 3, the mask 302 is comprised of an array of quadrilateral cells, e.g., exemplary cells 303 and 304, with identical layout contents. Scribe line regions 312 are formed as a grid separating the cells. Ideally, each exposure field 301 of the wafer 300 will receive identical patterns of the mask 302 regardless of the locations of the cells in the mask 302. This assumption substantially holds for conventional lithography enhancement techniques using non-EUV light source with wavelength greater than EUV, for example, a deep ultraviolet (DUV) light source. Therefore, the enhancement operation may be performed on a certain cell, e.g., the central cell 303 in the mask, and the enhancement result derived for cell 303 may be applied to other cells to save time and effort. This simplified framework is acceptable because the differences between enhancement results of various cells, such as the cell 303 and cell 304, are within a tolerable range. The minor deviation from the optimal enhancement caused by the unified enhancement result will not render noticeable performance degradation. However, in advanced technology nodes where EUVL is widely used, a unified lithography enhancement result may produce greater pattern differences in different cells that may adversely affect performance uniformity across the semiconductor wafer 300. The noticeable differences between lithography enhancement results may be at least due to the reflective lithography type used by the EUVL. Consequently, it is no longer desirable to apply a single lithography enhancement result acquired for a certain cell, such as the cell 303, to other cells in the same design layout, such as the cell 304. As a result, the processing time and cost for conducting lithography enhancement are increased dramatically. Such increases in time and cost will grow with the dimension cell array in the mask 302.

Figure 4:
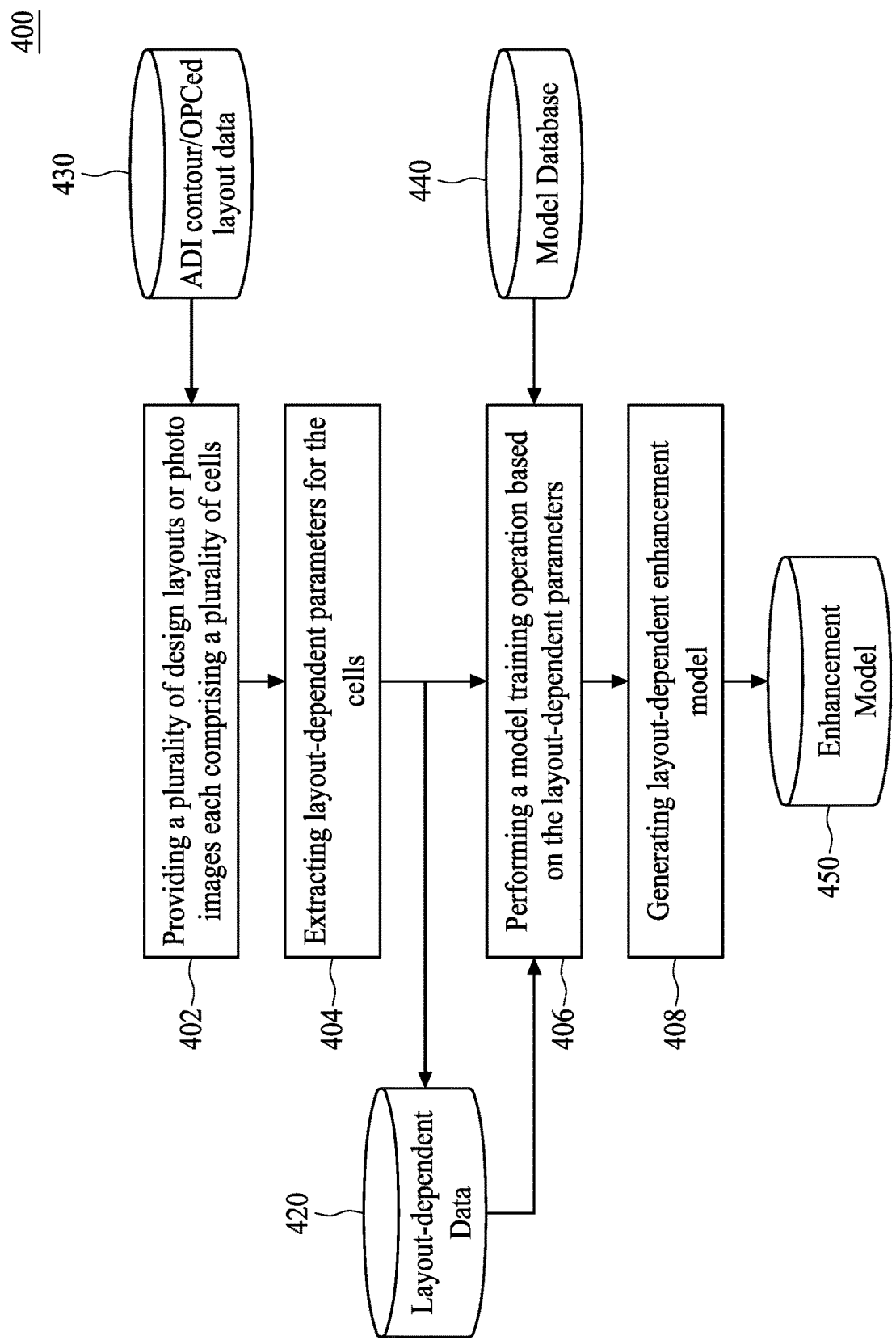
FIG. 4 is a flowchart of a training method for lithography enhancement, in accordance with some embodiments.

FIG. 4 is a flowchart of a training method 400 of lithography enhancement, in accordance with some embodiments. It is understood that additional steps can be provided before, during, and after the steps shown by FIG. 4, and some of the steps described below can be replaced or eliminated, for additional embodiments of the training method 400. The order of the steps may be interchangeable.

At step 402, a plurality of design layouts or photo images of semiconductor circuits, wherein each of the design layouts or photo images comprises a plurality of cells, are provided. In an embodiment, the plurality of design layouts are obtained from the design house 120 and have passed the examination so that the plurality of design layouts meet the requirements for manufacturing. The design layouts or photo images may be retrieved from a database 430. In an example, the database 430 stores design layout patterns of OPCed design layouts 122a provided by the mask house 130 that have undergone OPC operations and the LPC operations completed by the mask house 130. In another embodiment, the photo images used in the step 402 include historical contour images obtained from fabricated IC products. For example, the database 430 stores ADI contour images of the patterns based on scanning electron microscope (SEM) images of various manufactured wafers provided by the wafer manufacturer 150. The patterns in the confirmed OPCed design layouts 122a or the SEM ADI contours images of the patterns in the wafers are used as training materials for generating the enhancement model 250 in FIG. 2 and providing directions of improved enhancement results on similar patterns.

Figure 5C:
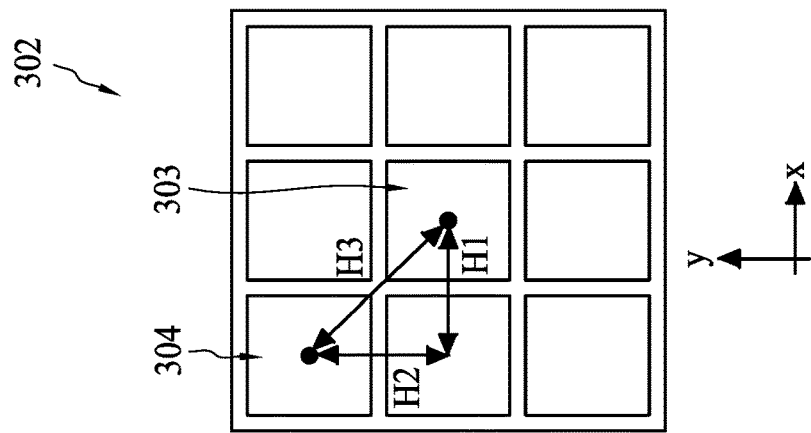
FIGS. 5A to 5C are schematic diagrams showing examples of extracting layout-dependent parameters for the training method of FIG. 4, in accordance with some embodiments.
Figure 5B:
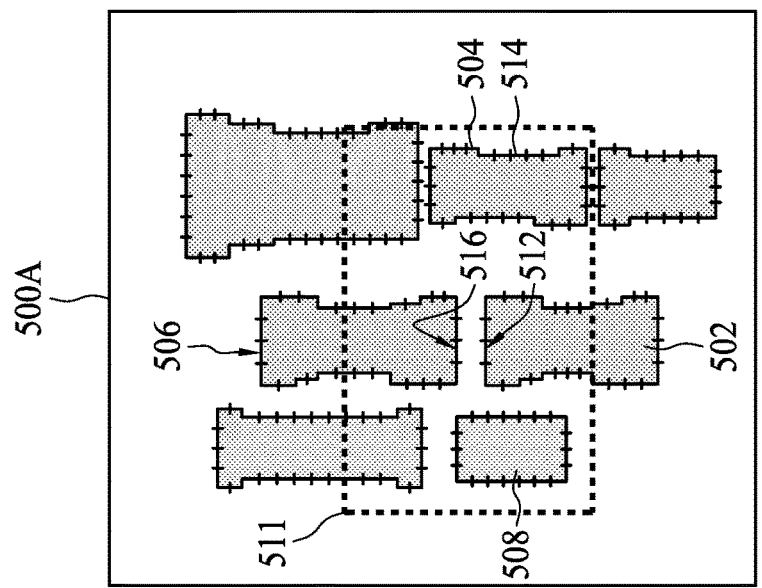
Figure 5A:
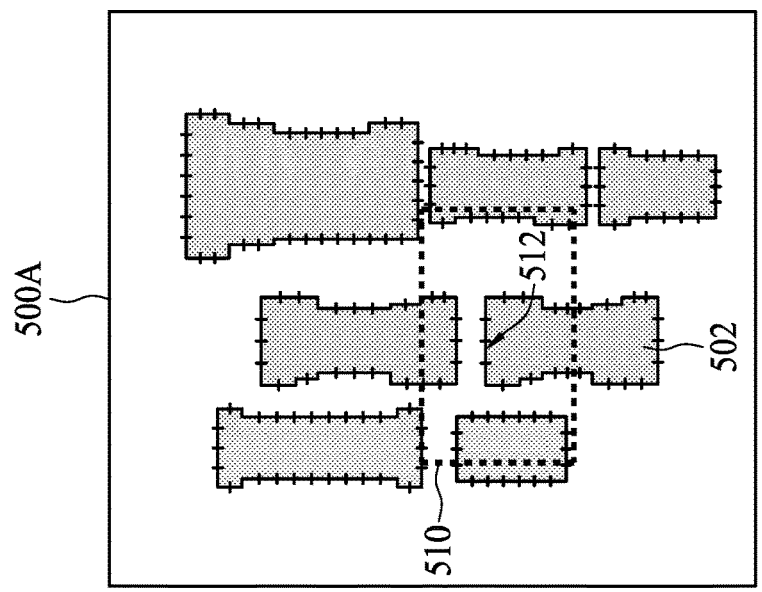

At step 404, various layout-dependent parameters for the cells are extracted. The layout-dependent parameters are to be stored in a database 420. These layout-dependent parameters may play important roles in accessing the correlation of a same segment in different cells of a design layout. The layout-dependent parameters may include different types. FIGS. 5A to 5C show schematic diagrams of extracting layout-dependent parameters in the training method 400 of FIG. 4, in accordance with some embodiments. FIG. 5A shows an exemplary design layout 500A that may be a portion of a cell, e.g., cell 303, of the mask 302 in FIG. 3 and may have several patterns formed thereon, such as a polygon 502. Alternatively, the design layout 500A may be retrieved from the design layout or photo images in step 402. In an embodiment, the edge contour of the polygon 502 is partitioned into several segments including an edge segment 512 as the target segment. A first layout-dependent parameter for the edge segment 512 may include the exposure intensity value for the edge segment 512. An exposure zone 510 is defined as an area surrounding the edge segment 512. In an embodiment, the exposure zone 510 is of quadrilateral shape having a length or width of less than about 5 µm, e.g., a length between about 1 µm and about 2 µm. The exposure intensity value may be calculated in terms of a total amount or an average amount of radiation intensity received within the exposure zone 510 from an exposure source. In an embodiment, the first type of layout-dependent parameter is extracted within a cell. The exposure intensity value may be acquired based on a light propagation model, e.g., provided by a third-party vendor, and is dependent upon factors such as the source intensity, source wavelength, projection angle and numerical apertures of the mirrors/lenses used in exposure. The exposure intensity values may vary for different segments and cells in the mask 302 due to the different light transmission routes and angles for different positions of the segments in the cell and the relative locations of the cells in the mask, and thus the exposure intensity in each edge segment is at least dependent upon the topology of the design layout 500A.

FIG. 5B illustrates a second type of the layout-dependent parameter extracted from the design layout 500A. In an embodiment, the edge segment 512 in the polygon 502 is set as a target pattern, and information of its neighboring patterns, such as polygons 504, 506 and 508, is recorded. The layout topology, such as the proximity and density of patterns, around the edge segment 512 will influence the final exposure performance of the edge segment 512. In an embodiment, the second type of layout-dependent parameter is extracted on an intra-cell basis. This parameter characteristic of spatial relationship with respect to a segment of interest may aid in identifying a same or similar segment in other cells, and thereby facilitate computation of inter-cell correlation. In an embodiment, a neighborhood zone 511 is defined as an area surrounding the edge segment 512 for determining the second type of the layout-dependent parameter. In an embodiment, the second layout-dependent parameter may include the pattern types of patterns in the neighborhood zone 511 facing the target segment, e.g., a side edge of a pattern (e.g., segment 514 and polygon 508) or an end edge (e.g., segment 516). In an embodiment, the distances between the target segment 512 and its neighboring segments (e.g., segments 514, 516 and the polygon 508) are calculated. In an embodiment, the second type of layout-dependent parameter is represented by a density coefficient based on the neighborhood zone 511 for the target segment 512. For example, the density coefficient may be an average distance across all neighboring patterns in the neighborhood zone 511. As a result, the level of similarity of segments in terms of their surroundings across different cells or the inter-cell correlation of a same segment can be computed and compared based on the abstracted density coefficient or the like. The aforesaid distances or pattern types may be closely related to the topology of design layout 500A and hence the second type parameter is layout dependent.

In an embodiment, the proposed scheme receives the design layout 500A, where OPC has been completed, and performs parameter extraction on the design layout 500A. For example, hammerhead-like features are added to end portions of the polygons 502 and 506. In some other embodiments, the proposed scheme also adopts a design layout that has not been OPC-enhanced. Although the conditions of neighboring patterns may be slightly different due to the shifted edge segments, the essential features of layout-dependent surrounding patterns can still be derived therefrom.

FIG. 5C illustrates extraction of a third type of layout-dependent parameter from the layout data for the mask 302. In an embodiment, the relative distances between the different cells are acquired. For example, the third type of layout-dependent parameter may include the distances between the cell 303 and the cell 304 along the x-axis (shown as distance H1) or the y-axis (shown as distance H2). The distances H1 and H2 may be calculated with respect to similar reference points in the cells, such as the geometric center, a vertex or other reference locations in the cell. In an embodiment, a linear distance H3 between the cells 303 and 304 measured from their geometric centers is acquired. The inter-cell distance may represent an average shift distance of a particular pattern between the two compared cells and reflects an average gap of lithography enhancement results between these two cells. Thus, the inter-cell distances are related to the cell arrangement and are layout dependent.

The layout-dependent parameters including at least the types of data described with reference to FIGS. 5A to 5C are derived and compiled as a data set stored in the database 420, as shown in FIG. 4. The layout-dependent parameters illustrated in FIGS. 5A to 5C are illustrative only, and other types of layout-dependent parameters are also within the contemplated scope of the present disclosure.

Figure 5D:
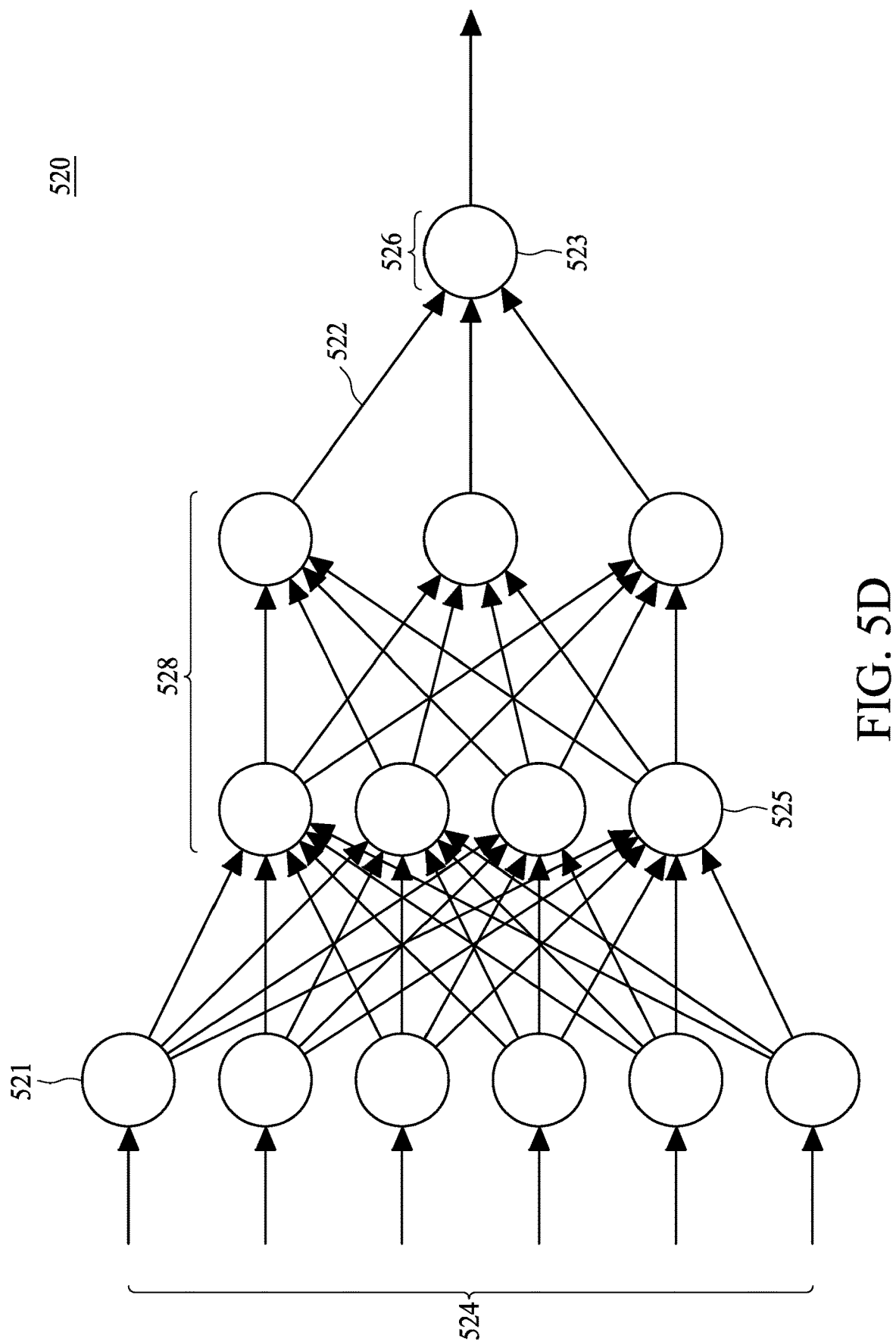
FIG. 5D is a schematic diagram showing an enhancement model for the training method of FIG. 4, in accordance with some embodiments.

Referring back to FIG. 4, at step 406, a model training operation is performed based on the derived layout-dependent parameters in the database 420. The training may be performed offline. A model database 440 comprising various types of training models is provided or generated for the model training operation. In an embodiment, in the model training operation 406, a model type is selected from the model database 440 to start a machine learning procedure. The selected model type can be an artificial neural network or other artificial intelligence learning model. FIG. 5D is a schematic diagram showing an exemplary training model 520 for the training method 400 of FIG. 4, in accordance with some embodiments. The training model 520 has a model type of an artificial neural network that is constructed by a group of neurons (nodes) 521 interconnected through connections 522 with respective weights. The group of nodes may form various layers, e.g., an input layer 524 comprised of input nodes 521, an output layer 526 comprised of an output node 523 and one or more hidden layers 528 comprised of hidden nodes 525. Parameters of the training model 520 may also be determined, such as the number of nodes in each of the input layer 524, the output layer 526 and the hidden layers 528, and the interconnection topology of the connections 522. In an embodiment, the output layer 528 may include multiple output nodes 523. In the present embodiment, a large amount of lithography enhancement data based on the databases 420 and/or 430 is fed to the machine-learning procedure. The polygons in the cell patterns of the design layout are partitioned into edge segments. The edge segments of polygons in the cells before enhancement and their counterpart edge segments after enhancement are provided to the input nodes 521 and the outputs node 523, respectively. In some embodiments, the layout-dependent parameters derived as discussed in reference to FIGS. 5A to 5C are also provided to the input layer 524 to serve as auxiliary information for enhancing training. An iterative training process for the hidden node layers 528 is performed until the values of the hidden nodes 525 attain converged values. In an embodiment, the converged values of the hidden layer 528 are obtained using the edge segments before lithography enhancement techniques and the layout-dependent parameters as the input layer 524, and using segments after lithography enhancement techniques as the output layer 526. The values of hidden nodes 525 are regarded as attaining convergence in terms of a cost function in which these converged values of the hidden nodes 525 correspond to a minimal cost value.

At step 408, a layout-dependent enhancement model 450 is generated and output. The enhancement model 450 may be equivalent to the enhancement model 250 in the mask layout preparation block 132 of FIG. 2. Parameters, such as the model type, the model configuration and the converged values of the hidden nodes 525 of the training model 520, are included in the enhancement model 450. The parameters of the enhancement model 450 may also contain, e.g., the number of layers and the number of nodes in each layer of the training model 520. The training model 520 is an example model to be included in the enhancement model 450, and other types of models can be alternatively or additionally added to the enhancement model 450.

Figure 6:
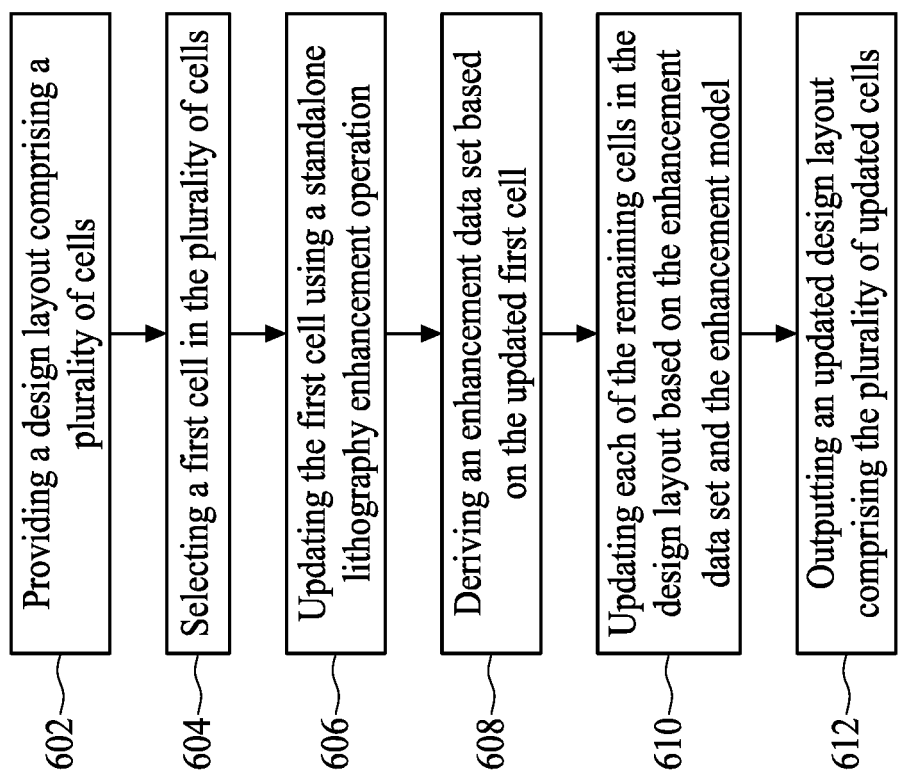
FIG. 6 is a flowchart of a method of lithography enhancement, in accordance with some embodiments.

FIG. 6 is a flowchart of a lithography enhancement method 600, in accordance with some embodiments. The method 600 may be performed by the OPC module 230 and the SOPC module 235 in FIG. 2. It is understood that additional steps can be provided before, during, and after the steps shown by FIG. 6, and some of the steps described below can be replaced or eliminated, for additional embodiments of the lithography enhancement method 600. The order of the steps may be interchangeable.

At step 602, a design layout comprising a plurality of cells is provided. The design layout is provided by the design house 120 or the LOP module 210 of the mask house 130, and the design layout has not undergone any lithography enhancement processing by the mask house 130. At step 604, a first cell in the plurality of cells is selected as a reference cell. In an embodiment, the first cell is a central cell in the design layout (e.g., cell 303 in the mask 302 of FIG. 3), in which the geometric center of the mask 302 coincides with the selected first cell. In an embodiment where the geometric center of the mask 302 is spaced apart from all the cells in the mask, the first cell is selected as the cell having a minimal distance to the geometric center of the design layout.

At step 606, the first cell is enhanced or updated using a standalone lithography enhancement operation. In an embodiment, the standalone lithography enhancement operation is performed by the OPC module 230 of FIG. 2. In an embodiment, the enhancement operation begins with partitioning the edge contours of polygons of the first cell into edge segments. At least one variation (e.g., movement) of each edge segment in the polygons is derived, and reshaped or added features are added to the original polygon based on the information of the first cell only. For example, the light propagation and exposure model, the pattern topology or the exposure intensity for the patterns within the first cell are provided during the lithography enhancement operation in step 606. In an embodiment, a model-based enhancement is relied on in step 606 to simulate the eventual contour deformation and derive the displacement value to compensate for such deformation. In the aforesaid model-based enhancement, a light field for the cell is constructed for calculating the composite effects of light reaching the cell of interest from each direction. This model-based enhancement may consume a great deal of computation time and resources. Meanwhile, the remaining cells in the design layout are not enhanced or updated by any lithography enhancement operations, e.g., by the OPC module 230. In an embodiment, the topology information of the remaining cells of the design layout is not provided during enhancement of the first cell. In other words, the reference cell is OPC-enhanced without recognizing the existence of the surrounding cells in the design layout. In an embodiment, the update operation for the first cell at step 606 relies upon the light transmission and exposure models for EUV. Through the lithography enhancement operation in step 606, each updated polygon in the first cell is constructed by the respective updated (or reshaped) edge segments. An updated first cell corresponding to the first cell is generated accordingly.

At step 608, an enhancement data set is derived based on the updated first cell. The enhancement data set may include geometrical changes to or movements of the edge segments of the polygons in the first cell. The enhancement data set is obtained through the model-based OPC approach, and therefore, should contain desired OPC enhancement results without simplification. In an embodiment, the enhancement data set includes the direction of changes or the displacement values for the updated edge segments. The enhancement data set may also include the type or number of added features. In alternative embodiments, the enhancement data set includes a list of layout or exposure conditions of an edge segment corresponding to the changed edge segment. For example, the enhancement data set includes a mapping of the exposure intensity values of an edge segment to the shape (or location) of the original edge segment and/or the shape (or location) of the enhanced edge segment in the enhanced first cell. In an embodiment, the enhancement data set includes a mapping of topology information around an edge segment to the shape (or location) of the original edge segment and/or the shape (or location) of the enhanced edge segment in the enhanced first cell. The topology information around the edge segment may include the shape (e.g., line, rectangle or square), pattern type (side segment or end segment), distance and other geometrical information of edge segments surrounding the enhanced edge segment. In another example, the enhancement data set includes a mapping of the exposure intensity values or topology information around an edge segment to the changed dimension of that edge segment. In an embodiment, the enhancement data set includes extracted layout-dependent parameters, in a manner similar to those extracted in FIGS. 5A to 5C, of the first cell alone.

At step 610, each of the remaining cells in the design layout is updated based on the enhancement data set and the enhancement model 450. In an embodiment, the operations of step 610 are performed by the SOPC module 235 of FIG. 2. In some embodiments, the layout of each of the remaining cells is identical to that of the reference cell. In a manner similar to that performed at step 606, the enhancement operation for each of the remaining cells starts with partitioning the polygons of the cells into segments. The enhancement model 450 is relied on to perform in-situ enhancement for the cells, e.g., leveraging the structure of the training model with well-trained internal structures. Taking the training model 520 as example, the well-trained values of the hidden nodes 525 are provided along with the selected model type (e.g., the artificial neural network), and at least one edge segment partitioned from polygons of the cells is provided to the input layer 524 of the training model 520. The newly obtained enhancement data set derived based on the first cell may also be fed into the training model 520 as inputs. The output layer 526 provides an enhancement result corresponding to the input segment based on the calculation network of the converged hidden layers 528. In an embodiment, the output layer 526 of the training model 520 provides the direction and the changed dimensions of the enhanced segment. In an embodiment, the enhancement operation is configured to assign a non-OPC-enhanced edge segment (e.g., its location, shape, surrounding patterns, inter-cell distance, segment index, etc.) in the remaining cells concurrently with the same edge segment in the first cell as inputs to the input layer 524 and obtain an enhanced edge segment at the output layer 526 by configuring the hidden layers 528 with the converged values. In some embodiments, each edge segment in each cell of the design layout is given a respective segment index, and thus an edge segment in one of the remaining cells can correspond to the same edge segment in the first cell through the same segment index. Since the training model 520 has been tuned off-line with performance-proven data, its structure along with the well-trained hidden nodes 528 provides a good mapping between an edge segment without OPC enhancement and its OPC-enhanced counterpart with a minimal cost value. Accordingly, the training model 520 can be used to derive an updated edge segment for any newly-input edge segment of the remaining cells with such minimal cost value. This effect holds especially for the enhanced edge segments of the remaining cells having the same segment index as that in the first cell. In an embodiment, the update operation at step 610 is performed without consideration of the light transmission and exposure models for EUVL, thus the computation efforts and cost for performing model-based enhancement are saved. Through the lithography enhancement operation in step 610, each updated polygon for the respective cells is constructed by the respective updated (e.g., translated, moved or reshaped) edge segments. An updated cell for the respective cell is generated accordingly.

It should be noted that the updating operation of step 610 for each of the remaining cells in the design layout is different from that performed for the first cell alone at step 606 in that the remaining cells are enhanced based on the enhancement results for the first cell. In an embodiment, each of the remaining cells in the design layout is updated based on the enhancement data set of the first cell. It has been found that most of the enhancement result discrepancies between different cells are marginal and predictable by well-trained enhancement models. Assuming that the remaining cells comprise identical layout configurations with the first cell prior to OPC enhancement and that the eventual enhancement results are within a moderate range, the enhancement trends for the remaining cells can be reasonably predicted by at least the enhancement data set based on the first cell and the enhancement model 450. Therefore, a set of updated cells corresponding to the remaining cells is generated. At step 612, an updated design layout comprising the plurality of updated cells is output. In an embodiment, the model configurations and parameters for the enhancement 450 can be refined by using different input data that better fits layout characteristics of various applications. The updated design layout is output to the LPC module 240 in FIG. 2 and may undergo additional checking operations for being used by the IC manufacturer 150.

Figure 7:
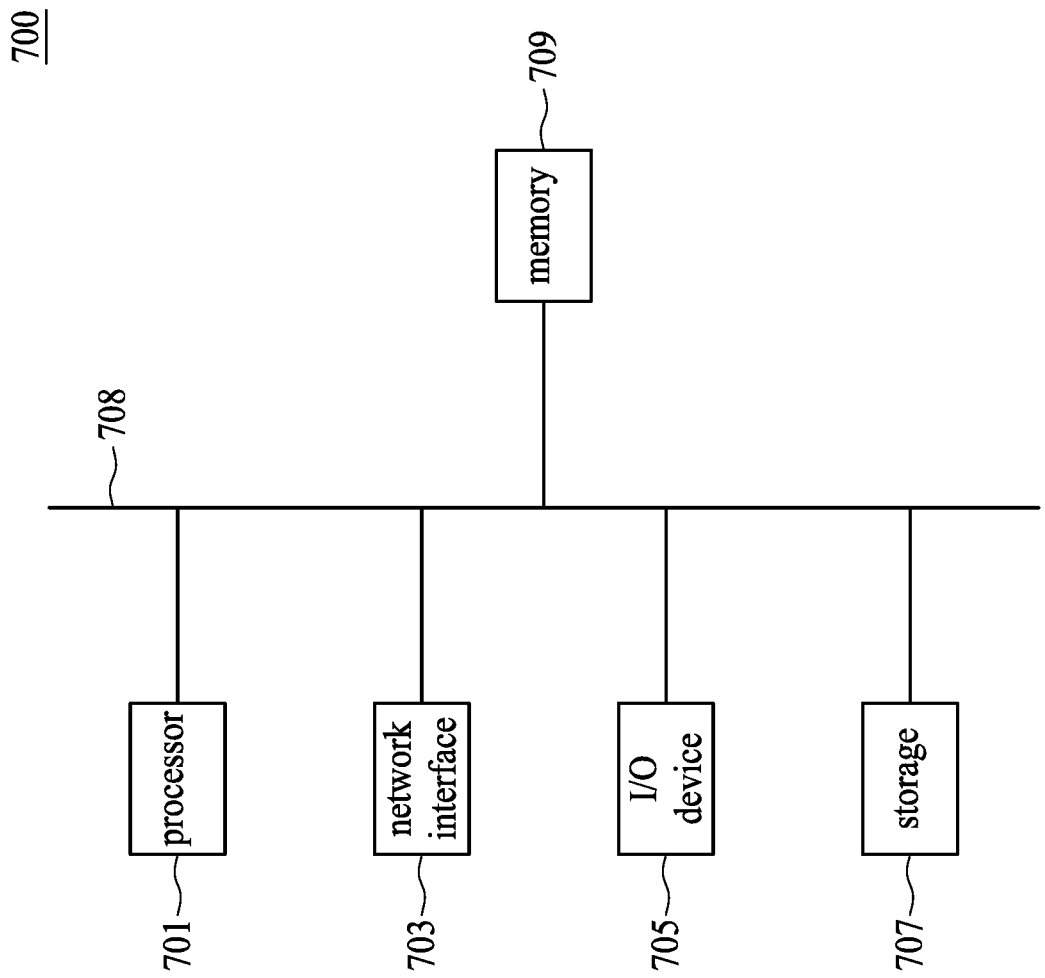
FIG. 7 is a schematic diagram of a system implementing a lithography enhancement method, in accordance with some embodiments.

FIG. 7 is a schematic diagram of a system for implementing a lithography enhancement method, in accordance with some embodiments. The system 700 includes a processor 701, a network interface 703, an input and output (I/O) device 705, a storage 707, a memory 709, and a bus 708. The bus 708 couples the network interface 703, the I/O device 705, the storage 707, the memory 709 and the processor 701 to each other.

The processor 701 is configured to execute program instructions that include a tool configured to perform the method as described and illustrated with reference to figures of the present disclosure. Accordingly, the tool is configured to execute the steps, such as providing design specifications, generating design layout data, performing OPC operations, performing LPC operations, extracting layout-dependent parameters, performing enhancement model training and enhancing a cell using the enhancement model.

The network interface 703 is configured to access program instructions and data accessed by the program instructions stored remotely through a network (not shown).

The I/O device 705 includes an input device and an output device configured for enabling user interaction with the system 700. In some embodiments, the input device comprises, for example, a keyboard, a mouse, and other devices. Moreover, the output device comprises, for example, a display, a printer, and other devices.

The storage device 707 is configured for storing program instructions and data accessed by the program instructions. In some embodiments, the storage device 707 comprises a non-transitory computer readable storage medium, for example, a magnetic disk and an optical disk.

The memory 709 is configured to store program instructions to be executed by the processor 701 and data accessed by the program instructions. In some embodiments, the memory 709 comprises any combination of a random access memory (RAM), some other volatile storage device, a read only memory (ROM), and some other non-volatile storage device.

According to an embodiment, a method includes: providing a first design layout comprising a plurality of cells; updating a first cell in the plurality of cells using optical proximity correction to provide a first updated cell and a data set; updating a second cell from remaining cells in the first design layout based on the data set to provide a second updated cell; and manufacturing a mask based on the first updated cell and the second updated cell in the first design layout.

According to an embodiment, a method includes: providing a design layout comprising a plurality of cells; performing a lithography enhancement operation on a first cell in the plurality of cells to provide a first updated cell; deriving a data set based on the updated cell for the first cell; providing a model comprising a mapping of cells before lithography enhancement and after lithography enhancement; updating a second cell in the plurality of cells by reshaping polygons of the second cell based on the data set and the model to provide a second updated cell; and manufacturing a mask based on the first updated cell and the second updated cell.

According to an embodiment, a system includes one or more processors and one or more programs having instructions which, when executed by the one or more processors, cause the system to: provide a design layout comprising a plurality of cells; update a first cell in the plurality of cells using optical proximity correction to provide an updated cell and a data set; update a second cell in the design layout based on the data set to provide a second updated cell; and manufacture a mask based on the first updated cell and the second updated cell in the design layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a first design layout comprising a plurality of cells;
updating a first cell in the plurality of cells using optical proximity correction in the absence of information on remaining cells in the first design layout to provide a first updated cell and a data set;
generating a model based on a layout-dependent parameter of a second design layout;
updating a second cell from remaining cells in the first design layout based on the data set to provide a second updated cell; and
manufacturing a mask based on the first updated cell and the second updated cell in the first design layout,
wherein at least one of the providing, updating, and manufacturing is executed by one or more processors,
wherein the model comprises an input layer, a hidden layer and an output layer, and the hidden layer comprises nodes, wherein training the model comprises obtaining converged values of the nodes of the hidden layer, wherein obtaining converged values of the nodes of the hidden layer comprises:
partitioning polygon contours of cells in the second design layout into edge segments;
selecting a model type and number of layers for the model; and
iterating a loop of providing information on edge segments before lithography enhancement and information on edge segments after lithography enhancement to the input layer and the output layer, respectively, until values of nodes of the hidden layer attains convergence in terms of a cost function.

2. The method according to claim 1, further comprising manufacturing a semiconductor device using the mask.

3. The method according to claim 2, wherein manufacturing a semiconductor device using the mask comprises transferring patterns of the mask to a semiconductor material using extreme ultraviolet light lithography.

4. The method according to claim 1, wherein the plurality of cells in the first design layout are arranged in an array, further comprising selecting a third cell having a minimal distance to a geometric center of the array as the first cell.

5. The method according to claim 1, wherein updating a second cell from remaining cells in the first design layout comprises:
partitioning a polygon of the second cell into a plurality of edge segments;
deriving updated edge segments corresponding to the plurality of edge segments based on the data set; and
providing an updated polygon constructed by the updated edge segments to replace the polygon.

6. The method according to claim 1, wherein updating a second cell from remaining cells in the first design layout further comprises updating the second cell based on the model.

7. The method according to claim 1, wherein the layout-dependent parameter comprises an exposure intensity value for edge segments of cells in the second design layout.

8. The method according to claim 1, wherein the layout-dependent parameter comprises pattern types and distances of neighboring polygons with respect to edge segments of cells in the second design layout.

9. The method according to claim 1, wherein the layout-dependent parameter comprises a distance between different cells in the second design layout.

10. The method according to claim 1, wherein deriving updated edge segments based on the model comprises assigning information on an edge segment of the second cell as the input layer and obtaining information on an enhanced edge segment at the output layer with the hidden layer set as the converged values.

11. A method, comprising:
providing a design layout comprising a plurality of cells;
performing a lithography enhancement operation on a first cell in the plurality of cells to provide a first updated cell in the absence of information on remaining cells in the design layout;
deriving a data set based on the first updated cell for the first cell;
providing a layout-dependent model comprising a mapping of cells before lithography enhancement and after lithography enhancement;
updating a second cell in the plurality of cells by reshaping polygons of the second cell based on the data set and the layout-dependent model to provide a second updated cell; and
manufacturing a mask based on the first updated cell and the second updated cell,
wherein at least one of the providing, performing, deriving, updating, and manufacturing is executed by one or more processors,
wherein the layout-dependent model comprises an input layer, a hidden layer and an output layer, and the hidden layer comprises nodes, wherein the providing of the layout-dependent model comprises:
partitioning polygon contours of cells in a second design layout into edge segments;
selecting a model type and number of layers for the layout-dependent model; and
iterating a loop of providing information on edge segments before lithography enhancement and information on edge segments after lithography enhancement to the input layer and the output layer, respectively, until values of nodes of the hidden layer attains convergence in terms of a cost function.

12. The method according to claim 11, wherein the data set includes a mapping of exposure intensity values of an edge segment and a topology surrounding the edge segment in the first cell to a location of an updated edge segment, corresponding to the edge segment, in the first updated cell.

13. The method according to claim 11, further comprising generating the layout-dependent model obtained based on after-development inspection contour images of patterns in the second design layout.

14. The method according to claim 11, wherein updating a second cell in the plurality of cells further comprises performing the lithography enhancement operation without using light transmission or exposure models for lithography.

15. A system, comprising one or more processors and one or more programs including instructions which, when executed by the one or more processors, cause the system to:
provide a design layout comprising a plurality of cells;

update a first cell in the plurality of cells using optical proximity correction in the absence of information on remaining cells in the design layout to provide a first updated cell and a data set;
generate a layout-dependent enhancement model;
update a second cell in the design layout based on the data set to provide a second updated cell; and
manufacture a mask based on the first updated cell and the second updated cell in the design layout,
wherein the layout-dependent enhancement model comprises an input layer, a hidden layer and an output layer, and the hidden layer comprises nodes, wherein the generation of the layout-dependent enhancement model comprises:
partitioning polygon contours of cells in another design layout into edge segments;
selecting a model type and number of layers for the model; and
iterating a loop of providing information on edge segments before lithography enhancement and information on edge segments after lithography enhancement to the input layer and the output layer, respectively, until values of nodes of the hidden layer attains convergence in terms of a cost function.

16. The system according to claim 15, wherein the layout-dependent enhancement model is generated based on an artificial intelligent learning model.

17. The system according to claim 15, wherein the instructions, when executed by the one or more processors, further cause the system to perform logical operations on the plurality of cells prior to updating the first cell.

18. The system according to claim 15, wherein the layout-dependent enhancement model is generated based on layout-dependent parameters of another design layout.

19. The system according to claim 15, wherein the data set includes a mapping of exposure intensity values of an edge segment and a topology surrounding the edge segment in the first cell to a location of an updated edge segment, corresponding to the edge segment, in the first updated cell.

20. The system according to claim 15, wherein the updating of the second cell in the design layout further comprises performing a lithography enhancement operation without using light transmission or exposure models for lithography.

* * * * *